(12) United States Patent
Sahu et al.

(10) Patent No.: US 8,560,985 B1
(45) Date of Patent: Oct. 15, 2013

(54) CONFIGURATION-BASED MERGING OF COVERAGE DATA RESULTS FOR FUNCTIONAL VERIFICATION OF INTEGRATED CIRCUITS

(75) Inventors: Bijaya Sahu, Ghaziabad (IN); Sandeep Pagey, Noida (IN); Frank Armbruster, Erfurt (DE); Hannes Froehlich, East Sussex (GB)

(73) Assignee: Cadence Design Systems, Inc., San Jose, CA (US)

( * ) Notice: Subject to any disclaimer, the term of this patent is extended or adjusted under 35 U.S.C. 154(b) by 6 days.

(21) Appl. No.: 13/226,481

(22) Filed: Sep. 6, 2011

Related U.S. Application Data

(63) Continuation-in-part of application No. 12/426,188, filed on Apr. 17, 2009, now Pat. No. 8,413,088, which is a continuation-in-part of application No. 11/759,758, filed on Jun. 7, 2007, now Pat. No. 7,890,902.

(51) Int. Cl.
*G06F 17/50* (2006.01)

(52) U.S. Cl.
USPC .......................................................... 716/106

(58) Field of Classification Search
USPC .......................................................... 716/106
See application file for complete search history.

(56) References Cited

U.S. PATENT DOCUMENTS

| | | | |
|---|---|---|---|
| 7,093,216 B2 * | 8/2006 | Nozuyama | 716/106 |
| 7,181,708 B1 * | 2/2007 | Du et al. | 716/106 |
| 7,278,056 B2 * | 10/2007 | Hekmatpour | 714/37 |
| 7,320,090 B2 * | 1/2008 | Coulter et al. | 714/30 |
| 7,409,654 B2 * | 8/2008 | Wood et al. | 716/136 |
| 7,415,684 B2 * | 8/2008 | Harer et al. | 716/106 |
| 7,506,288 B1 * | 3/2009 | Ip et al. | 716/106 |
| 7,886,242 B1 * | 2/2011 | Chakraborti et al. | 716/106 |
| 7,890,902 B1 * | 2/2011 | Sahu et al. | 716/106 |
| 7,900,183 B2 * | 3/2011 | Bhinge | 716/136 |
| 8,001,505 B2 * | 8/2011 | Bist et al. | 716/106 |
| 8,161,449 B2 * | 4/2012 | Bhinge et al. | 716/136 |
| 8,214,782 B1 * | 7/2012 | Chakraborti et al. | 716/106 |
| 8,219,947 B2 * | 7/2012 | Bist et al. | 716/106 |
| 8,255,861 B2 * | 8/2012 | Bhinge | 716/136 |
| 2002/0002698 A1 * | 1/2002 | Hekmatpour | 716/4 |
| 2004/0230928 A1 * | 11/2004 | Nozuyama | 716/5 |
| 2005/0251767 A1 * | 11/2005 | Shah et al. | 716/4 |
| 2007/0180414 A1 * | 8/2007 | Harer et al. | 716/5 |
| 2010/0070935 A1 * | 3/2010 | Bist et al. | 716/4 |
| 2010/0070940 A1 * | 3/2010 | Bist et al. | 716/5 |
| 2010/0169853 A1 * | 7/2010 | Jain et al. | 716/5 |

\* cited by examiner

*Primary Examiner* — Stacy Whitmore

(74) *Attorney, Agent, or Firm* — Alford Law Group, Inc.

(57) ABSTRACT

In one embodiment of the invention, a method for verification of an integrated circuit design is disclosed. The method includes independently executing simulation runs in response to a plurality of coverage models to respectively generate a plurality of coverage data for a plurality of functional blocks within one or more integrated circuit designs; generating a target coverage model to selectively merge at least first coverage data associated with a first coverage model and second coverage data associated with a second coverage model; and in response to the target coverage model and the plurality of simulation runs, selectively projecting the plurality of coverage data into a merged coverage data result associated with the target coverage model. The method may further store the merged coverage data results into a storage device. The plurality of simulation runs may include at least one functional simulation run and at least one formal verification run.

20 Claims, 11 Drawing Sheets

CONFIGURATION-BASED MERGING OF COVERAGE DATA RESULTS FOR FUNCTIONAL VERIFICATION OF INTEGRATED CIRCUITS

CROSS REFERENCE TO RELATED APPLICATIONS

This patent application is a continuation in part and claims the benefit of U.S. patent application Ser. No. 12/426,188 entitled VERIFICATION PLANS TO MERGE DESIGN VERIFICATION METRICS filed on Apr. 17, 2009 by Frank Armbruster et al., which claims the benefit of U.S. patent application Ser. No. 11/759,758, entitled METHODS AND APPARATUS FOR MERGING COVERAGE FOR MULTIPLE VERIFICATION AND DESIGN SCENARIOS, filed Jun. 7, 2007, by Bijaya Sahu et al., now issued as U.S. Pat. No. 7,890,902; both of which are hereby incorporated by reference in their entirety.

FIELD

The embodiments of the invention relate to functional verification of integrated circuit designs.

BACKGROUND

Functional verification of digital hardware design at register transfer level (RTL) is important in the design cycle of an integrated circuit design. Despite the emphasis on verification, typically seventy percent (70%) or more of integrated circuit design tape-outs require rework or redesign and another spin or re-spin through the design cycle. One cause of the rework in the initial IC design is the logic or functional defects that otherwise could have been caught at a functional verification stage of the IC design.

Thus, verification of an IC design prior to manufacture of the design is important to avoid rework and redesign and lower overall costs of integrated circuit designs.

BRIEF SUMMARY

The embodiments of the invention are best summarized by the claims that follow below. Briefly in accordance with one embodiment of the invention, a method for verification of an integrated circuit design is disclosed. The method includes independently executing simulation runs in response to a plurality of coverage models to respectively generate a plurality of coverage data for a plurality of functional blocks within one or more integrated circuit designs. The method further includes generating a target coverage model to selectively merge at least first coverage data associated with a first coverage model and second coverage data associated with a second coverage model. Further, in response to the target coverage model and the plurality of simulation runs, the method includes selectively projecting the plurality of coverage data into a merged coverage data result associated with the target coverage model. A processor may be used to automate one or more functions of the method. The method may further store the merged coverage data results into a storage device. The plurality of simulation runs may include at least one functional simulation run and at least one formal verification run.

BRIEF DESCRIPTIONS OF THE DRAWINGS

DETAILED DESCRIPTION

In the following detailed description of the embodiments of the invention, numerous specific details are set forth in order to provide a thorough understanding of the present invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

INTRODUCTION

Recent advances in verification technology include methodologies such as metric-driven verification (MDV), assertion-based verification (based on simulation and formal verification) and plan-to-closure methodology. These methodologies help reduce functional verification time and increase verification productivity.

Metric-driven verification is a new verification methodology that helps to reduce the overall design cycle of an integrated circuit. Several recent methodologies like open verification methodology (OVM), verification methodology manual (VMM) and universal verification methodology (UVM) have been adopted to provide a framework to achieve metric-driven verification. These methodologies provide configurability features to reuse the verification environment across runs and projects and further provide various advanced test-benches.

However to determine overall coverage results for an integrated circuit design, it is desirable to merge coverage data together into a single data base.

Prior merging solutions for merging block level and system level coverage data may be found for example in U.S. Pat. No. 7,890,902 issued to Sahu et al, entitled "Method and Apparatus for Merging Coverage for Multiple Verification and Design Scenarios" incorporated herein by reference (referred to herein as the "Sahu Patent". The Sahu Patent provides (i) a system to block coverage merge operation; (ii) a block to system coverage merge operation; (iii) merging of simulated device under test with different test-benches; and (iv) a merging of functional coverage points added in an incremental method. The Sahu Patent further provides two types of merge modes, a union merge mode or a standard merge mode (also referred to as a no-union mode). Users can select either the union merge mode or a standard merge mode to merge an entire set of different coverage databases together.

Prior merging solutions may have limited flexibility. For example an existing approach of merging coverage databases merges the source database in the context of the target database. Consequently, the resulting merged database retains the context of the target database after the merge operation. However, a verification engineer may not be interested in seeing or analyzing the resulting complete database in the target database context. A verification engineer may want to focus solely on a subset of the source database or the target database.

Figure 5:
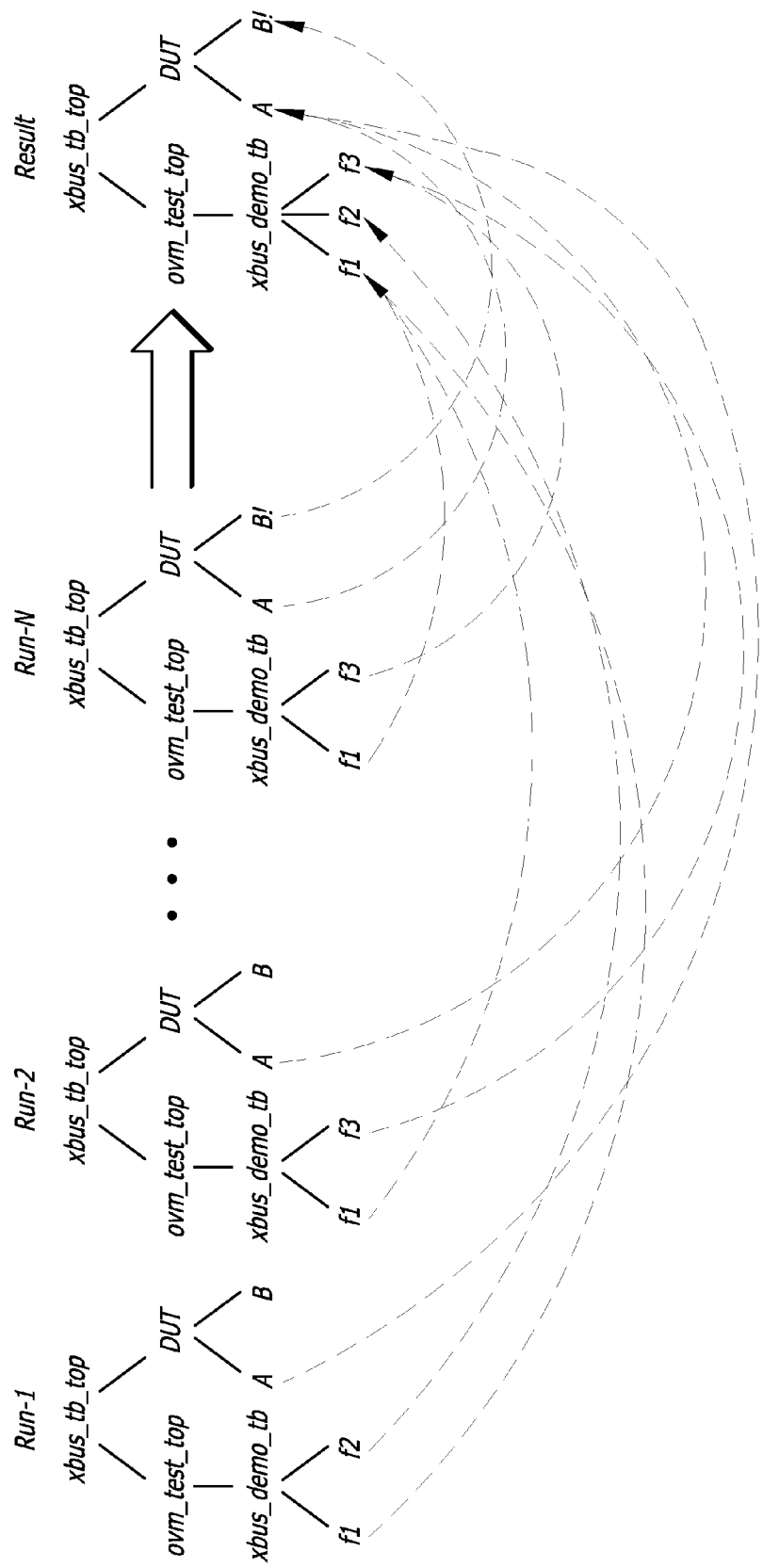
FIG. 5 is a diagram illustrating a plurality of verification runs of a configured test-bench hierarchy with a DUT hierarchy that has undergone bug fixes over the verification runs.

Prior merging solutions may be further inflexible as they may be unable to configure a data base merge operation. For example, an entire database could be either merged in a union merge mode or a standard merge mode. But in a practical verification scenario, the device under test (DUT) and the verification environment may both undergo many changes or modifications. As a result, a user may be interested in merging a portion of a hierarchy of a design in a standard (or NO-UNION) mode and merging the other portion of the hierarchy of the design in a UNION merge mode (such as shown in FIG. 5).

Prior merging solutions allow the specification of the top-level modules to be merged which limits the user to specify the exact target node. For example referring momentarily to FIG. 3B, to aggregate the merged count of sub-block A, a user specifies sub-block A as the top-level module for the merge operation. The merge operation then implicitly assumes the first instance of sub-block-A (system.A1 in Run-1) is the target node and merges all instances of sub-block-A of Run-2 (system.A2, system.A3). Because merging takes place on the basis of instances of the specified top-level module, a user cannot separately merge different configurations (e.g., 16-bit and 32-bit configuration of sub-block-A) of the same module.

Furthermore, prior merging solutions lack a provision to create a coverage model when verification scope is increased. For example, the merging of coverage data of a block-level to a system-level is possible provided that a system-level coverage model is available. Because different blocks of a system are verified through different verification techniques oftentimes without a system-level coverage model, assuming a system-level coverage model is available when it is not is a significant limitation in merging coverage data.

It is desirable to provide a coverage data merge solution to merge the databases of complex verification scenarios in a metric-driven verification flow.

The embodiments of the invention include a method, apparatus and system for configuration-based merge operations of verification coverage data. The merge application implemented using this algorithm provides a finer level of configuration features to merge coverage databases generated due to topological changes in device-under-test (DUT) and/or test-bench (TB) hierarchies across runs. It enables metric-driven verification in the presence of flexible DUT and TB structures.

Figure 11A:
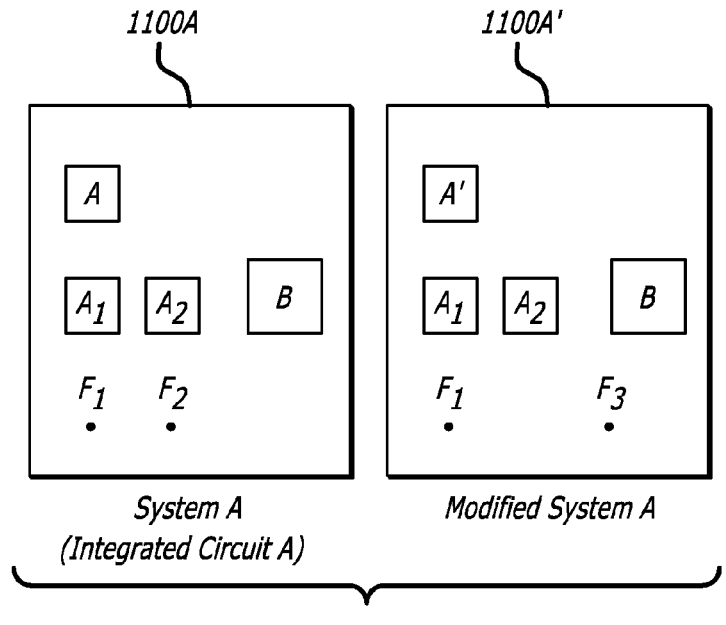
FIG. 11A is a block diagram of an integrated circuit with an original system design and a modified system design.

Referring momentarily to FIG. 11A, a test-bench for an integrated circuit A 1110A and/or a device under test (DUT) may be modified. In a first verification run, a first coverage point F1 and a second coverage point F2 of a first test-bench hierarchy are selected to be analyzed. The test-bench hierarchy for the integrated circuit A may be modified in a second verification run. In the second verification run, the first coverage point F1 and a third coverage point F3 of a second test-bench hierarchy may be selected to be analyzed as shown by a different set of functional coverage points in the modified integrated circuit A 1110A'.

Blocks within the same system or DUT, integrated circuit A 1110A, may also or alternatively be modified between verification runs. For example, in a first verification run, block A under system A of the DUT is to be analyzed. Block A may undergo modification to improve it, such as to correct a bug or reduce die size for example, to form a modified Block A' and a modified system A and integrated circuit A 1110A'. After the modification, it is desirable to verify the modified block and system meets the functional requirements at the block and system levels. A second verification may be run to verify the modifications. However, it is desired that coverage results of the first verification run be used to more efficiently verify the modified system. The second verification run may need only verify the modified block A' in order to verify the modified system A'. In which case, it is desirable to merge coverage data results of the first and second verification runs together.

Figure 11B:
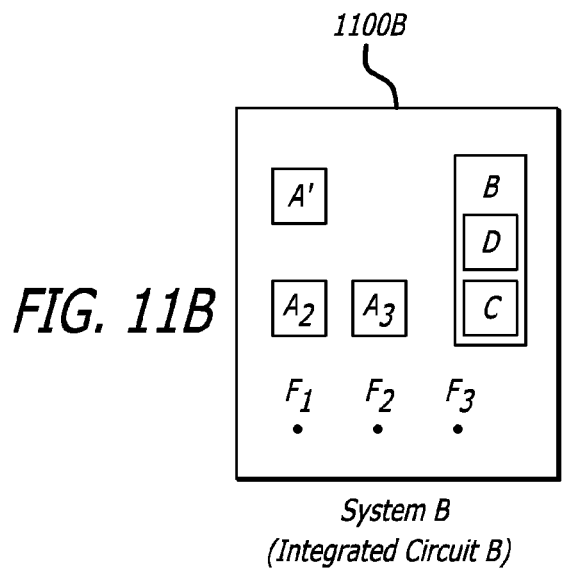
FIG. 11B is a block diagram of an integrated circuit with a second system design differing from the system design of FIG. 11A but employing similar blocks.

Alternatively with reference to FIG. 11B, a different system, system B of integrated circuit B 1100B, a second DUT, may have already verified the modified block A'. Coverage results of the modified block A' determined during the verification run for system B may be desirable to merge into the modified system A to verify it.

Moreover, functional coverage results of block A may be used for each and every instance of block A (e.g., A1, A2, A3) in a system of an integrated circuit design or DUT/DUV. Additionally, verification results of an instance of a block may be merged into the coverage results for block A from which the instance was formed. Block A may be in a library, for example, so that verification results of it are accumulated over runs and different systems.

Furthermore with reference to FIGS. 11A-11B, coverage results of a prior system and its blocks may be desirable to use in the verification of a new system. The functional verification results (test-bench, coverage model, system and blocks) of the integrated circuit 1100A' may be used and merged with another verification run to verify the integrated circuit 1100B, for example. Sub-blocks C and D may have been used in block B for example of system B for integrated circuit 1100B. Verification results from a verification run of integrated circuit 1100A' may be merged with verification results of sub-blocks C and D to obtain verification results for the integrated circuit 1100B, for example. Coverage results of functional verification points F1, F2 of integrated circuit 1100A during a first run and verification points F2, F3 of integrated circuit 1100A' during a second run may be merged together for the functional verification points F1, F2, and F3 of integrated circuit 1100B.

Figure 1:
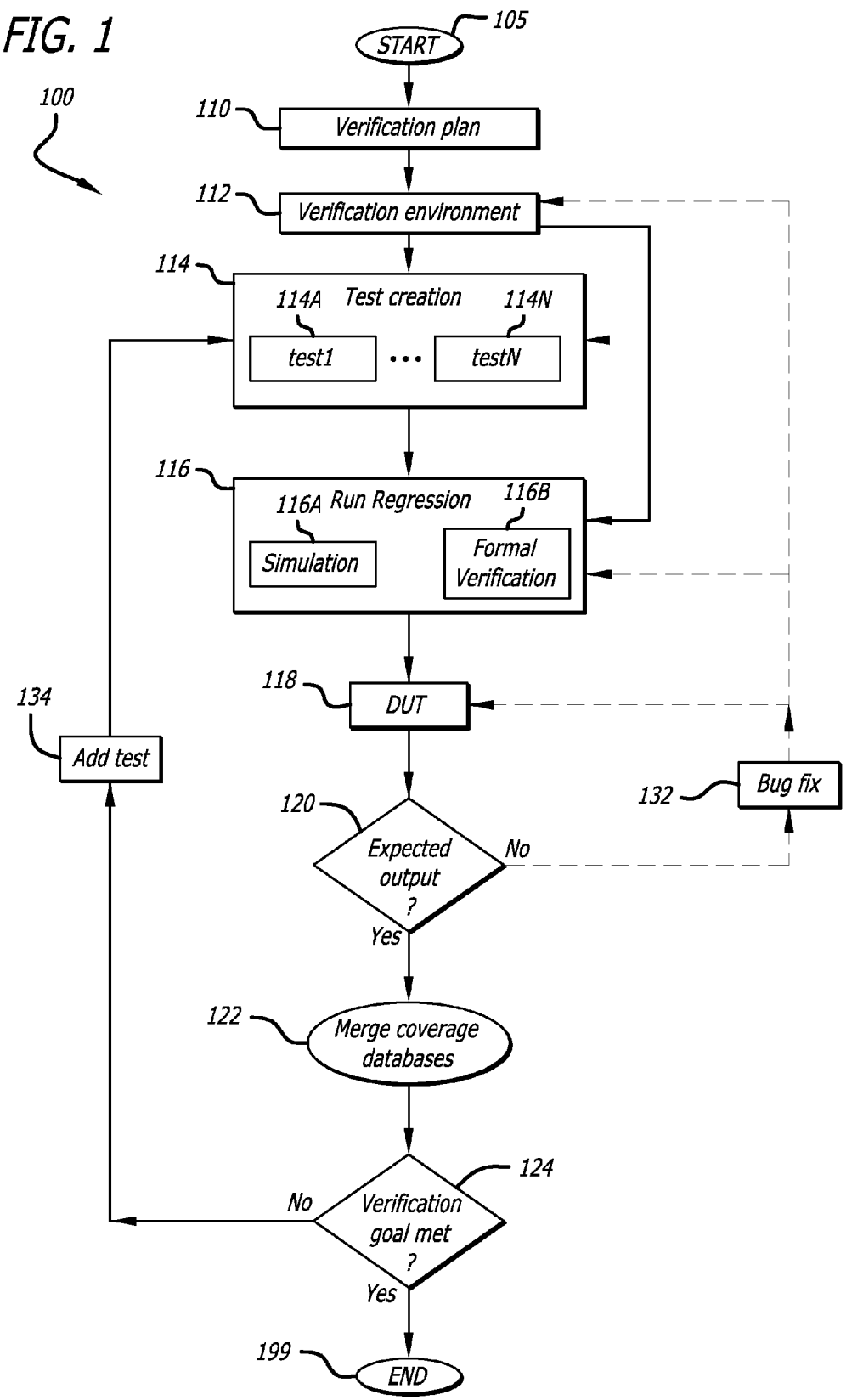
FIG. 1 is a flow diagram of metric driven verification for a device under test (DUT) or a device under verification (DUV), such as an integrated circuit design and its parts, partitions, modules, blocks, or sub-blocks.

Referring now to FIG. 1, an exemplary metric-driven design verification flow 100 for an integrated circuit design is illustrated. The metric-driven verification flow 100 begins at process 110 with a verification plan. A good verification plan should list all verification goals such as interesting scenarios, corner cases, and error conditions that are to be tested.

At process 112, a verification environment (test-bench) is created which consists of different verification components. A verification environment contains functional coverage points Fi which represent legal, illegal, and boundary conditions that need to be tested.

At process 114, one or more tests are written for the integrated circuit design.

At process 116, in response to the tests being created, simulation 116A and or formal verification 116B can be performed on the integrated circuit design 118, the device under test (DUT).

At process 120 a determination is made in the output results. If bugs are found during simulation 116A and/or formal verification 116B, an unexpected output result, fixes/repairs are determined at process 132 and then added into the integrated circuit design 118 so that further testing can then be done. If the bug rate drops below a certain predefined level, collection of coverage data is enabled and the process goes to process 122.

At process 122, coverage databases generated during regression of all tests are merged together.

At process 124, the coverage/check metrics of the merged result is analyzed to determine if the goals of the verification plan have been met and verification closure completed.

If the merged coverage results are not satisfactory, additional tests may be further added to the regression suite at process 134 and the tests repeated at process 114 If the coverage results are satisfactory, the process goes to process 199 and can end. The process may start over from the beginning at the starting point 105, if there are changes to the verification plan 110 or environment 112. However, prior coverage results that remain valid for blocks, sub-blocks, or parts/partitions of an IC design may still be used during the merge process to speed up verification.

The merging process 122 of different coverage databases to analyze the verification progress is important in metric-driven verification flow. The embodiments of the invention provide desirable merging capability in the merging process 122 for successful deployment of metric-driven verification methodologies.

The embodiments of the invention have a number of advantageous aspects. One aspect is the ability to specify the mapping of source to target instance/type. The merge configuration provides a way to specify the mapping between source to target instance and module/type. The mapping rule is flexible and can be one-to-one, one-to-many, many-to-one or many-to-many. This gives flexibility in merging when a functional module/black box design intellectual property (IP), e.g., ARM processor, is configured according to the requirements of the IC design project.

Another aspect of the embodiments is the ability to do a union merge on a portion of the design and use the latest one on a different portion of the design. A test-bench is configured from test to test while a device under test (DUT), the IC design, undergoes many rounds of bug fixes. The embodiments of the invention provides a feature to perform a union merge on a part of the design and use the latest verification result (i.e. no union mode) from another part of the design to obtain system level verification results.

Another aspect of the embodiments is the ability to collect coverage data with respect to a design context. The embodiments of the invention provide flexibility to the user to merge results with respect to a design context. A user can specify the initial coverage model according to their needs.

Another aspect of the embodiments is the creation of A coverage model according to user requirements. The embodiments of the invention provide a feature to create the coverage model according to one or more user requirements. For example, a user can create the system-level coverage model from the block-level coverage model. This may be required for block to system-level verification that uses metrics like coverage or checks to validate the completeness. In such cases, metrics data of various verification engines is merged together to create the system-level coverage model. The merging of metrics coverage data and creation of the system-level coverage model shortens the time to complete verification at a system-level.

Different Verification Scenarios

Verification scenarios for integrated circuit designs are becoming increasingly complex with the advancement in verification methodologies such as MDV. Exemplary verification scenarios which make merging more complex are now described.

Merging when the Device Under Test (DUT) and the Verification Environment (VE) Undergo Changes.

Changes in the DUT/VE could be because of bug fixes in the DUT/VE or changes of different sub-blocks of the DUT and verification components Case-1: Merging when HDL of Same DUT Across Runs is Modified Due to Bug Fixes.

Usually functional coverage is the primary ingredient of a coverage model at an early stage of verification. Different functional coverage points F are written to cover interesting scenarios, corner cases and error conditions which catch the design bugs. The bugs are fixed in subsequent versions of the DUT. Also fixes or corrections are made in the verification environment.

Figure 2:
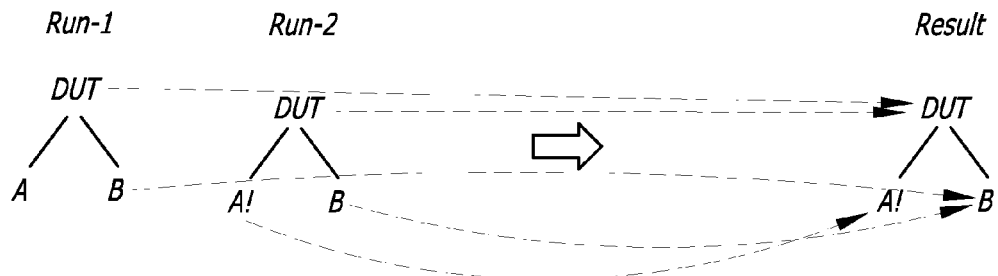
FIG. 2 is a diagram illustrating a coverage data merge operation when the high-level design description language is modified across verification runs for the same device under test.

FIG. 2 illustrates the scenario where there are two verification runs, Run-1 and Run-2, are merged together into a merged coverage result for the latest version of a device under test (DUT). The verification run Run-2 is run on the latest version of the DUT. The latest version of the DUT includes a module A! that has HDL code changes for bug fixes over that of the prior version of the module A. The prior version of the module, module A has the bugs that needed fixing. To efficiently verify the latest version of the DUT, it is desirable to merge coverage of all runs assuming that the latest DUT is the best or golden one.

Merging verification coverage of both verification runs, Run-1 and Run-2 can be achieved by the following command:

merge Run-1 Run-2 -initial_model Run-2 -out Result

Case-2: Configuration Changes of Different Sub-Blocks Of the DUT and Verification Components.

Configuration changes of different sub-blocks of the DUT and verification components for the DUT may consist of different sub-blocks. A sub-block may be any configurable design IP (parameterized module).

Figure 3A:
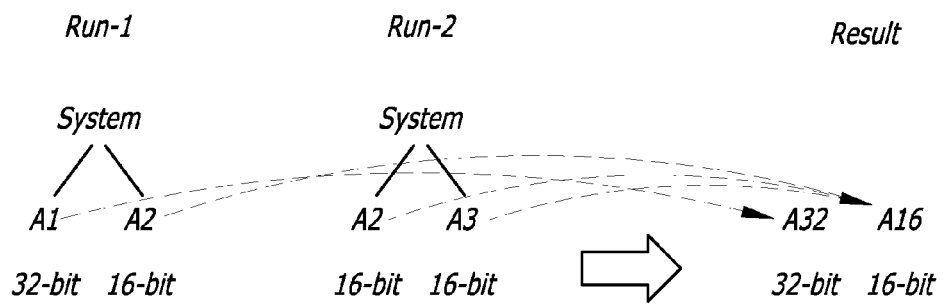
FIG. 3A is a diagram illustrating a coverage data merge operation merging identical configurations together into separate targets.

FIG. 3A illustrates merging of verification results for a sub-block with different configurations. In a first verification run, Run-1, the system is configured to contain two instances of the same sub-block A (A1 and A2) having different configurations (e.g., a 32 bit configuration and a bit configuration). But in a second verification run, Run-2, the same system is reconfigured and contains two instances of the same sub-block A (A2 and A3) having identical configuration (e.g., a 16 bit configuration). In this case, it is desirable to merge coverage results for the identical component of each sub-block. Coverage results for instances for sub-block A with the 16 bit configuration are merged together into A16. Coverage results for instances for sub-block A with the 32 bit configuration are merged together into A32.

Figure 3B:
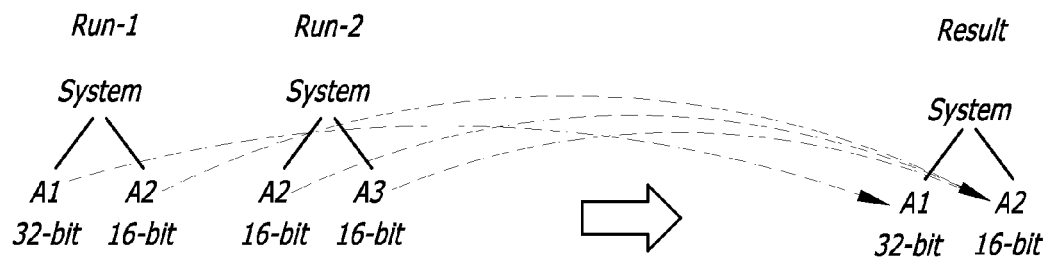
FIG. 3B is a diagram illustrating a coverage data merge operation merging identical configurations together into separate targets in the context of a particular run.

FIG. 3A shows the merge verification scenario where the coverage data of identical configurations are collected without any context. The following are the merge commands that can be used to achieve that objective:

merge_config -source System.A1 -target A32
    merge_config -source System.A2 -target A16
    merge_config -source System.A3 -target A16
    merge Run-1 Run-2 -initial_model empty -out Result However, a user may want to collect the coverage data of identical configurations for a sub-block in the context of a verification run. For example, if a user wants to collect the coverage data of identical configurations in the context of the first verification run Run-1 then following merge commands can be used:

merge_config -source System.A2 -target System.A2
    merge_config -source System.A3 -target System.A2
    merge Run-1 Run-2 -initial_model Run-1 -out Result FIG. 3B illustrates this merge scenario for verification runs. With respect to the system (DUT) executed with the first verification run, Run-1, the results of the 16 bit configurations for sub-block A are merged together under instance A2 of the sub-block A. The results of the 32 bit configurations for sub-block A are merged together under instance A1 of the sub-block A.

The verification environment (VE) can also be configured and similarly merged together. The verification environment consists of different verification components (VC) that can be configured across different verification runs of a DUT or circuit. The different configurations of verification components can lead to different functional coverage results across runs.

Figure 4A:
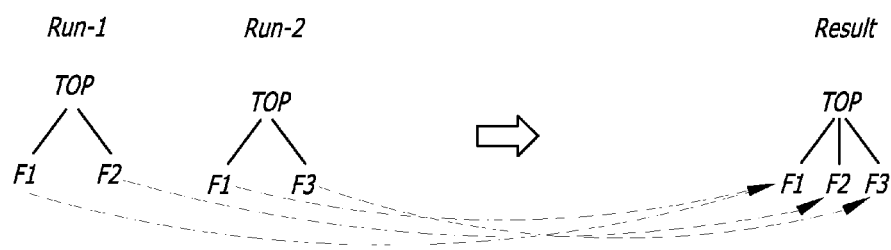
FIG. 4A is a diagram illustrating a coverage data merge operation with a UNION mode, commutatively merging identical configurations together but with functional coverage points changing across runs.

FIG. 4A illustrates such a merge scenario where functional coverage points vary across different verification runs. In a first verification run, Run-1, first and second functional coverage points F1 and F2 are selected to obtain functional coverage results. In a second verification run, Run-2, the second functional coverage point F2 is deselected/removed and a new third functional coverage point F3 is selected/added to obtain different coverage results. In this case, the objective is to merge all functional coverage points across all runs in an aggregate mode so that the merged result contains a union of all functional coverage points.

As shown in FIG. 4A, under the top level hierarchy of the device under test or integrated circuit design, coverage results of the first coverage point F1 in each of Run-1 and Run-2 are merged together to obtain a merged coverage result F1 for the first coverage point. Coverage results of the second coverage point F2 of Run-1 is merged together under the Top hierarchy as the merged coverage result F2 for the second coverage point. Coverage results of the third coverage point F3 of Run-2 is merged together under the top hierarchy results as the merged coverage result F3 for the third coverage point.

When functional cover points change across runs, to merge the coverage results of all of the functional points from all verification runs, the following merge command with union mode may be used:

merge Run-1 Run-2 -initial_model union_all -out Result

However, the objective may be to treat the latest verification run as the base/primary verification run and accumulate selected functional coverage points of the primary run that were present in the earlier coverage runs (e.g., run-1) under it. The following command may be used to merge coverage results from selected functional points together under the base/primary verification run:

merge Run-1 Run-2 -initial_model Run-2 -out Result

Figure 4B:
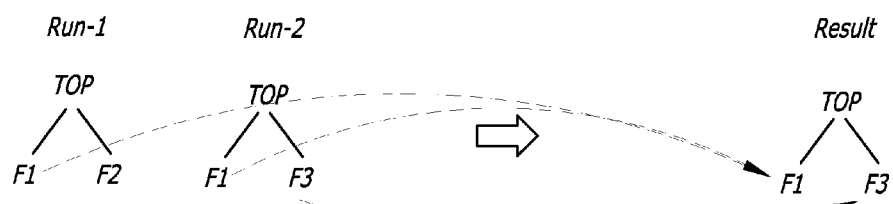
FIG. 4B is a diagram of a coverage data merge operation with a NO-UNION mode, merging identical configurations but with functional coverage points changing across runs, in the context of a particular run.

Referring now to FIG. 4B, a merge diagram illustrates this case of merging prior coverage results of selected functional coverage points that are within the latest verification run, Run-2.

The latest verification run, Run-2, includes functional coverage points F1 and F3 but not coverage point F2. The earlier verification run, Run-1, includes functional coverage points F1 and F2 but not functional coverage point F3.

Coverage results of the first coverage point F1 in each of Run-1 and Run-2 are merged together to obtain a merged coverage result F1 for the first coverage point.

Coverage results of the third coverage point F3 of Run-2 is merged together under the top hierarchy results as the merged coverage result F3 for the third coverage point. However, the coverage results for the second coverage point F2 under the first verification run, Run-1, is ignored as it was not in the latest function coverage run.

Case 3: Bug Fix in DUT and Configuration Change in Verification Environment

Referring now to FIG. 5, another verification scenario is shown where both the device under test (DUT) and the verification environment undergoes changes. In this case, the test-bench part xbus_demo_tb (a hierarchy rooted under the test top level of hierarchy, ovm_test_top) is configured across runs so that the functional coverage varies across runs. For example, in the first run, Run-1, the functional cover points F1 and F2 are selected while under the second run, Run-2, the functional cover points F1 and F3 are selected in the hierarchy. In this case, the DUT part (the circuit hierarchy rooted at DUT) varies as well over the verification runs due to undergoing bug fixes between runs. For example, Block B in the DUT of the first verification run was corrected to remove a bug and generated corrected Block B! in the DUT in the Nth verification run, Run-N. The register transfer logic (RTL) code representing the DUT of latest verification run (e.g., Run-N) is considered as the best or golden code. In this verification scenario it is desirable to perform different types of merge operations in the DUT hierarchy and the test-bench hierarchy.

Since the DUT hierarchy has undergone bug fixes, the latest verification run (e.g., Run-N) is considered as the golden RTL version. A user may wish to perform a merge coverage operation of the DUT hierarchy with a take_latest mode (where the DUT hierarchy of coverage model with the latest timestamp is used to collect the coverage data) and perform a merge coverage operation of the test-bench hierarchy with a union or aggregate mode (where the test-bench hierarchy of coverage model of all runs are unioned together). It is desirable that a merging tool be flexible in the form of configuration to merge given different versions of the DUT and test-bench topologies.

FIG. 5 illustrates a scenario in which the DUT is simulated with different test-benches (env) which contain different sets (e.g., Run-1 with F1,F2 and Run-2 with F1,F3) of functional coverage points. The objective is to merge the test-benches hierarchy with UNION mode and merging DUT hierarchy taking the latest design from Run-N.
To achieve this, following command are used:
    merge_config -source xbus_tb_top.ovm_test_top.xbus_demo_tb -target xbus_tb_top.ovm_test_top.xbus_demo_tb -resolution union
    merge -run_order by_timestamp Run2 Run-1 -initial_model Run-2 -out Result Merging Coverage Data Created by Different Verification Technologies to Verify Different Parts of the Integrated Circuit Design.

Presently, verification IC design engineers adopt different verification technologies like formal verification and functional simulation to test the various blocks within an integrated circuit design, such as a system on chip (SOC). Thereafter coverage data of each block is merged together to create the complete context of functional coverage verification for the integrated circuit design.

Figure 6A:
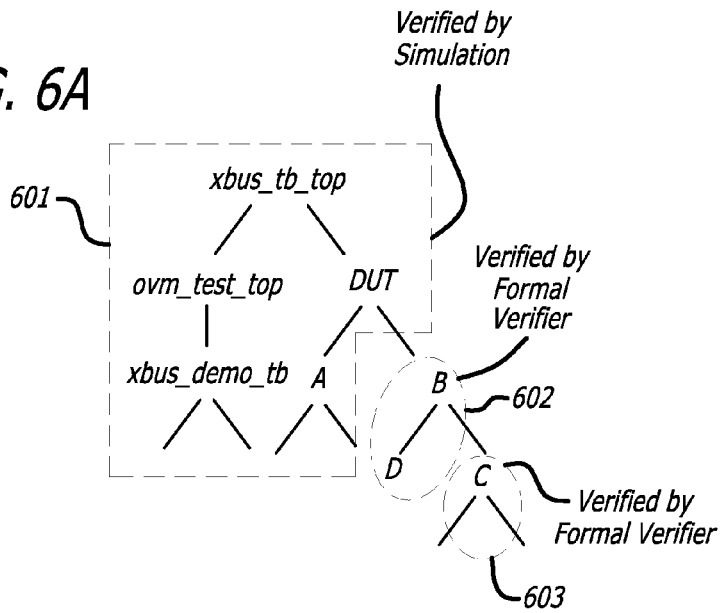
FIGS. 6A-6C are diagrams illustrating the merger of different coverage databases generated by a functional simulation engine and a formal verification engine.

Referring now to FIGS. 6A, a verification scenario is illustrated in which an entire hierarchy of a DUT (e.g., an integrated circuit design) is partitioned into multiple parts or partitions. For example, the DUT 600 is partitioned into a first part 601, a second part 602, and a third part 603 for separate design and verification by multiple design engineers in parallel. The first part 601 of the DUT includes the top level DUT, block A and its sub-blocks. A second part 602 of the DUT includes blocks B and D. A third part 603 of the DUT includes block C and its sub-blocks.

In this verification scenario the different parts or partitions of the DUT with its different sub-blocks, are verified through different verification techniques in a metric driven verification flow. For example, the first part 601 of the DUT may be verified by a functional simulation with a functional simulator by a simulation or design engineer. The second and third parts 602-603 of the DUT may be verified through formal verification techniques. Each verification engine (e.g., functional simulators and formal verifiers) that is used to verify each part of the DUT creates its own coverage model as respectively illustrated by the coverage models 606-608 shown in FIG. 6B.

Figure 6B:
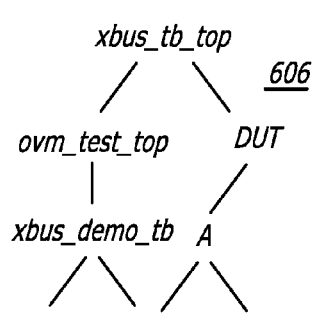
Figure 6B:
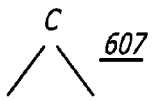
Figure 6B:
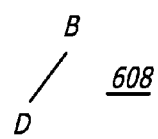

As illustrated in FIGS. 6A-6B, the first part 601 of the DUT is verified through a functional simulation with the simulation coverage model 606 using a functional simulator in a first simulation or verification run, Run-1. The second part 602 of the DUT is verified through formal verification of a formal verification coverage model 607 using a formal verifier in a verification run, Run-2. The third part 602 of the DUT is verified through formal verification of a different formal verification coverage model 608 using another formal verifier in another verification run, Run-3.

One aspect of the invention is to provide a verification merging tool that is sufficiently flexible in configuration to merge the coverage databases of different verification engines together to generate a complete verification context of the DUT. The different coverage models generated by the different verification engines are merged together to create the entire verification context for the DUT.

Figure 6C:
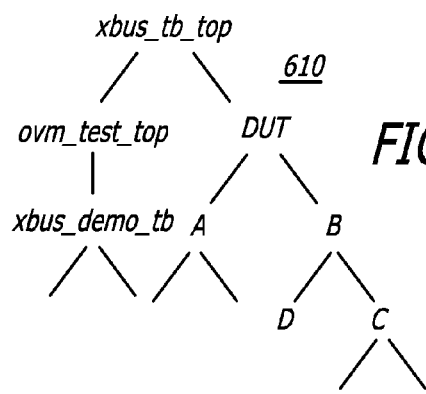

For example, FIG. 6C illustrates a merged coverage model 610 that was generated by merging together the simulation coverage model 606 generated by the functional simulator in a first run Run-1, the formal verification coverage model 607 in a second run Run-2, and another formal verification coverage model 608 in a third run Run-3. The merged coverage model 610 provides the complete DUT verification context for the DUT 600.

To merge the different coverage models 606-608, the following sequence of merge type commands may be used:
    merge_config -source B -target xbus_tb_top.DUT.B
    merge_config -source C -target xbus_tb_top.DUT.B.C
    merge Run-1 Run-2 Run-3 -initial_model Run-1 -out Result Merging Coverage Data of Identical Configurations in Different Design Contexts.

A system-on-chip (SOC) integrated circuit is divided into different functional blocks. Each functional block is verified separately. The different functional blocks are then stitched together by interconnecting nets to create the overall system. To verify the complete system on a chip, a DUT, an aspect of the invention is to merge the block-level coverage data into the system-level. Alternatively the system on a chip and its blocks may have already been verified so that additional verification data of the system run can be added to the block level verification of the block. In this case, an aspect of the invention is to merge the system verification data of the blocks and the block verification data together into the block level after the system on a chip, the DUT, has been verified.

Figure 7:
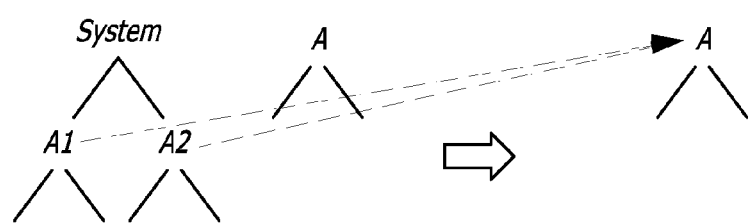
FIG. 7 is a diagram illustrating a system level to block level coverage data merge operation of system level verification runs and block level verification runs into block level results in accordance with an embodiment of the invention.
Figure 8:
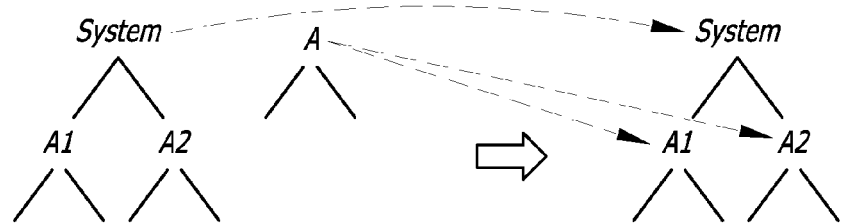
FIG. 8 is a diagram of a block level to system level coverage data merge operation of system level verification runs and block level verification runs into system level results in accordance with an embodiment of the invention.
Figure 9:
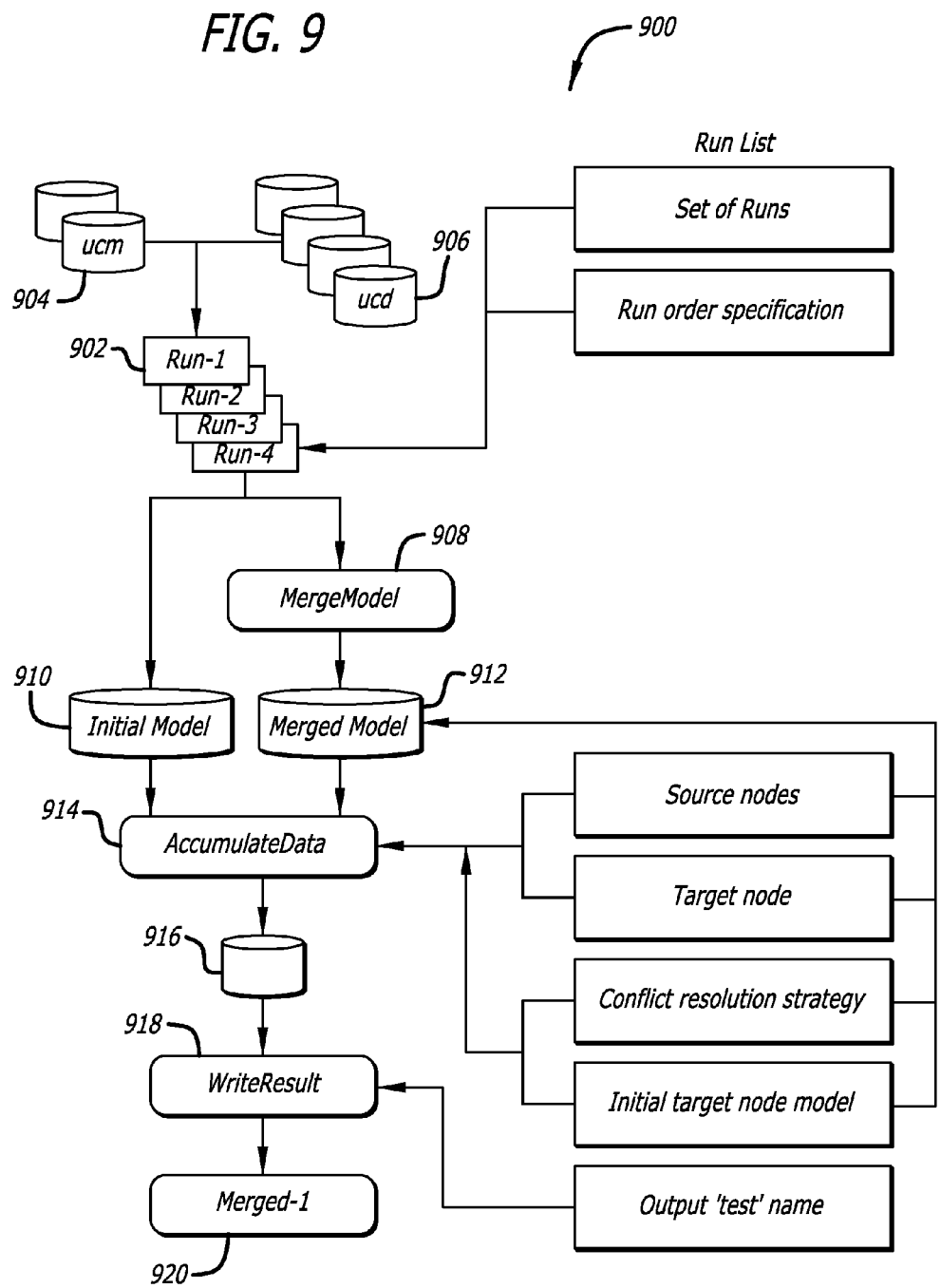
FIG. 9 is a block diagram illustrated semantics of a configuration based merge operation for metric driven verification.

Referring now to FIG. 7, a case of merging of coverage data from the system to the block-level is illustrated. In this verification scenario, coverage data of block-A is merged from the system (Run-1) into block-level (Run-2) context. This merge coverage operation from the system to the block-level is achieved through the following merge type commands (merge configuration command and merge command):
    merge_config -sourcetype A -targettype A
    merge Run-2 Run-1 -initial_model Run-2 -out Result Referring now to FIG. 8, a case of merging of coverage data from the block to the system-level is illustrated. In this verification scenario, coverage data of block-A is merged from the block-level (Run-2) into the system-level (Run-1) context. The coverage data of block-A is merged into each instance of the same block in the system-level context. This merge coverage operation from the block to the system-level is achieved through the following merge type commands (merge configuration command and merge command):
    merge_config -sourcetype A -targettype A
    merge Run-2 Run-1 -initial_model Run-1 -out Result Configuration-Based Merge Operation for Verification Data Referring now to FIG. 9, a functional block diagram is illustrated of a system 900 for a configuration-based merge operation. Each coverage or verification run 902 is associated with a model 904 in a unified coverage model (ucm) form and sampled coverage data 906 in a unified coverage data (ucd) form so that information for all coverage metrics such as block, expression, toggle, and assertion can be stored in a unified manner. The model 904 includes the structural information for a coverage or verification run. The sampled coverage data 906 includes the count information of a coverage run 902.

A set of verification runs 902 and a run order specification associated with each run forms a run list.

A set of coverage or verification runs could be specified either through run path specifications in the command line or they could be specified in a run file with a run file option -runfile in the merge command. A run file is a text file containing the test specifications and may include a name or link to the verification runs that are to be included in the set of runs 902.

The run order specification for each verification run 902 may be a time/date stamp when the verification run was executed or a user specified order number (e.g., run-1, run-2, . . . ) as specified by a user in a run order specification field of the merge command.

A merge configuration comprises one or more source nodes, at least one target node, a conflict resolution strategy (e.g., union, initial), an initial target node model (e.g., empty model, union of coverage models of all runs, or a coverage model of a primary run), and an output test name (e.g., merged-1). The merge configurations are used to map a source node to a target node while merging across hierarchy among the specified coverage or verification runs. The mapping could be one to one, one to many, many to one or many to many depending on the source and target options.

A configuration based merge operation may be executed in the following different processes or stages:

Target Model Generation Process 908, 910, 912:

Target model generation starts with an initial model 910. An initial target node model can be created from an empty model based on the user inputs. It can alternatively be a model formed by a user specified verification run. Alternatively, the initial model can be defined by the model of a primary verification run. In yet another embodiment, the initial target node model can be formed by a union of coverage models of all runs specified by the user.

All merge configurations are processed with the merge model command 908. A merge configuration specifies source nodes and a target node with a conflict resolution procedure mode (initial or union). If the initial target model is a model of any user specified run, a primary run, or a union of all runs; then source and target hierarchy specified in the merge configuration is unioned together to create the final target model (a merged model 912), provided that the conflict resolution mode is specified as union. If the initial target model is an empty model, all source nodes are copied into the empty model to create the final target model (a merged model 912).

Data Accumulation Process 914:

Individual coverage data (containing sampled coverage objects) of each run 902 can be projected into the target node model. The coverage data can be either the complete hierarchy or a particular hierarchy specified as an input. After creating the target model, coverage data of various runs are projected into the target model. In the case the merge configuration is specified, data projection is done for the specified source/target nodes. In the case the merge configuration is not specified, the complete data of the run is projected into the model.

Write Results Process 918:

The merged coverage results 916 in the target model are stored or written out into a storage device 920, such as a hard disk drive, by the write result operation 918 with the output test name.

A configuration based merge can be performed by software instructions by means of a number of merge type commands executed by a software verification tool. These commands and the use model are now described together in greater detail.

A merge command to merge coverage results uses merge configurations and a run list as its inputs.

Merge configurations can be specified through a merge configuration command merge_config. A Backus-Naur form (BNF), a meta-language or pseudo-code form, for the merge_config command is as follows:

```
merge_config {-source <source_instances> | -sourcetype
  <source_type>} \
    {-target <target_instance> | -targettype
  <target_type>} \
      [-resolution {initial | union}]
```

-continued

| Where <source_instances> | ::= <instancelist> |
| <instancelist> | ::= [(<language>)]<instance> [ <instancelist> ] |
| <source_type> | ::= [(<language>)]<type> |
| <target_instance> | ::= [(<language>)]<instance> (Full instance name) |
| <target_type> | ::= [(<language>)]<type> |
| <language> | ::= hdl | e |

Note that for high-level description languages (HDLs) (e.g., Verilog and VHDL) that are used to describe integrated circuit designs (the DUT), a module represents <type> in the merge configuration command. For the hardware verification language (HVL) "e", a struct or a unit represents the <type>. The <instancelist> should contain instances of same type.

There are a couple of defaults for the merge configuration command. In case the -resolution option is missing, then an initial conflict resolution mode is assumed to overcome conflicts. If the <language> of <instance> or <type> is not specified by the user, then HDL is assumed.

For complicated verification scenarios, multiple merge_config commands can be specified to set up the merge configuration and merge verification results together.

The merge command, merge, receives the run list and merge configurations and performs the merging of the verification results in response thereto.

The BNF details of merge command are as follows:

```
merge -output <out_path> [ -overwrite ] \
    { <runs> | -runfile <runfile> } \
    [<metric_types>] \
      [ -run_order { as_specified | by_timestamp } ] \
      [ -initial_model { empty | <runpath> | union_all |
  primary_run } ]
    Where <metric_types> ::= -metric [block:] [expression:]
  [toggle:] [fsm:] [assertion:] [covergroup]
      <runs> ::= <runpath> [ <runs> ]
        <runpath> ::= [[<workdir>/]<scope>/]<run>
```

Note that the <runfile> may be a file that contains <runpath> separated by a space character.

The merge command has a number of different options that can be selected by the user. The default values of options for run_order is "as specified" by the user in the command and for initial_model is the "primary_run" in the command. In the case that the run_order option is missing then the run order as_specified is assumed. In the case that the -initial_model option is missing then the target model starts with primary_run.

The merge command can receive a number of inputs to the command including a run list, a run order specification, one or more merge configurations, source nodes, target nodes, model conflict resolution, initial target model, and output test path name.

A run list consisting of a set of runs. A set of runs could be specified either through run path specifications in the command line or could be through run file option -runfile. Run file could be a text file containing the test specifications. Run path and run file can contain wildcard specification. An example of a run file is:

>cat run_file.txt
cov_work/DUT/Run-1 cov_work/DUT/Run-2

Run order specification. Run order is specified through -run_order option in the merge command. Run order could be based on either timestamp or as specified as the inputs to the merge command. If the run order is specified as by_timestamp then coverage databases are processed with reverse chronological order i.e. processing latest database first. If the run order is specified as as_specified then coverage databases are processed in the same order as they are specified on the command line. Note that the first run processed by the merge operation is referred to as the primary run and rest of the runs is referred to as secondary runs.

Merge configurations. The merge configurations are used to map a source node to a target node while merging across hierarchy among the specified coverage runs. The mapping could be one to one, one to many, many to one or many to many depending on the source and target option.

A merge configuration includes source nodes, target node, model conflict resolution strategy, an initial target model, and output test path name.

Source nodes. A source node is specified through -source or -sourcetype option in the merge_config command. If source node is an instance then -source option is used. Other way if source node is an HDL module or a "e" struct/unit then -sourcetype option is used. If -sourcetype <type> option is used, then the merge command will merge all instances of that <type>.

Target node. Target node is specified through -target or -targettype option in the merge_config command. If target node is an instance then -target option is used. Other way if target node is an HDL module or a "e" struct/unit then -targettype option is used. In case of -targettype <type> option, source node is merged in to all instance of that <type>. Note that the source node and target node should belong to same type. That is, the source and target node instances should belong to the same module, structure, or unit. If they are not the same type then an error condition may occur and merge stops.

Model conflict resolution strategy. Model conflict resolution is specified through -resolution option in the merge_config command. Conflict resolution could be either union or initial. Note that the initial conflict resolution strategy is significant only if the initial target model is specified as empty.

Initial target model. Initial target model is specified through -initial_model option in the merge command. The initial target model option is described herein.

If the initial target model option -initial_model is specified as empty in the argument of the command, the target model starts with an empty file. In this option, each source node is copied in case the target node does not exist and a new target model is created. The coverage data of each source node is then projected into the new target model.

With the target model starting from an empty model, the following table describes the behavior of the merge operation for different combinations of source and target nodes:

| Source node | Target node | Behavior |
| --- | --- | --- |
| -source tb.dut Or -sourcetype DUT | -target tb.dut | Since target is hierarchical name then merge assumes that tb.dut is already present in the model. In case it is not present then it creates the instance node. |
| -source tb.dut | -target DUT | Since target is non-hierarchical name so merge creates a copy of tb.dut in the name of DUT at the root of the target model. Incase module with name DUT is already present in the target model then it gives error and merge operation stop. If DUT is already present at the root in the target model, it is advisable to specify -targettype option. |
| -sourcetype DUT | -target DUT | Since target is non-hierarchical name so merge creates a copy of the instance of source module DUT in the name of DUT at the root of the target model. Incase module with name DUT is already present in the target model then gives warning and ignore the merge_config. |
| -source tb.dut Or -sourcetype DUT | -targettype DUT | Since -targettype is used so merge assumes that DUT is already present in the target model. If it is present then the source node is merged in to each instances of DUT. If it is not present then it is an error condition. |

Note that a new node is not created in case of -targettype option and the specified target type is missing.

With any run name (<run>) being specified in the argument to -initial_model option, a copy of the model of the specified run is created as the starting point of target model. The source node of each merge configuration is then unioned into the target node (incase present in the target initial model) if the conflict resolution strategy (-resolution union) is specified as union to create the final target model. In case the target instance node is missing then it is created. Note that in this mode, the merge configuration command with an initial conflict resolution has no significance.

After unioning the models of all runs, the -initial_model union_all option may be used. In this case, a unioning of all models of the specified runs creates the initial target model. Then the source node of each merge configuration is unioned into the target node (in case the source node is present in the target initial model) if the conflict resolution strategy (-resolution union) is specified as "union" to create the final target model. If the target instance node is missing in the command, it is automatically created. If the conflict resolution is specified in the merge command, an initial resolution chosen in the merge configuration command is not used and treated as insignificant.

If the primary run is selected as the initial model (-initial_model primary_run option is specified) in the merge command, a copy of the model of the primary run is created as the starting point of target model. In this case, the source node of each merge configuration is unioned into the target node (incase present in the target initial model) if the conflict resolution strategy (-resolution union) is specified as union to create the final target model. If the target instance node is missing in the merge commend, it is created automatically. Note that in this mode, with the conflict resolution specified in the merge command, an initial resolution chosen in the merge configuration command is not used and treated as insignificant.

Output test path name. The merged coverage data resulting from the merge coverage operation in response to the merge command is saved in a file in response to the output test path (<out_path>/<mergeresult_run>) specified by the -output option in the merge command. The merge command is checked up-front at the command line processing (CLI) stage with the expectation that the <out_path> file name exists. Otherwise without the option <out_path> file name specified in the merge command, the command can error out generating an error message and fails to execute. In an alternate embodiment, output file names and a path may be automatically generated if the -output option is not specified in the merge command.

The merged coverage result of the merge operation consists of a merged coverage model and merged coverage data. Both the merged coverage model and merged coverage data is saved in the merged output test path.

The following are some default options in the merge configuration command and the merge command:

If the conflict resolution option (-resolution) is missing in the merge_config command, then the initial conflict resolution is assumed.

If the -run_order option is missing then the run order option is assumed to be as_specified where the user specifies the run order of a plurality of verification runs.

If the -initial_model option is missing then the target model starts with an initial model defined by the primary_run.

Merge Coverage Data Algorithm

Figure 10:
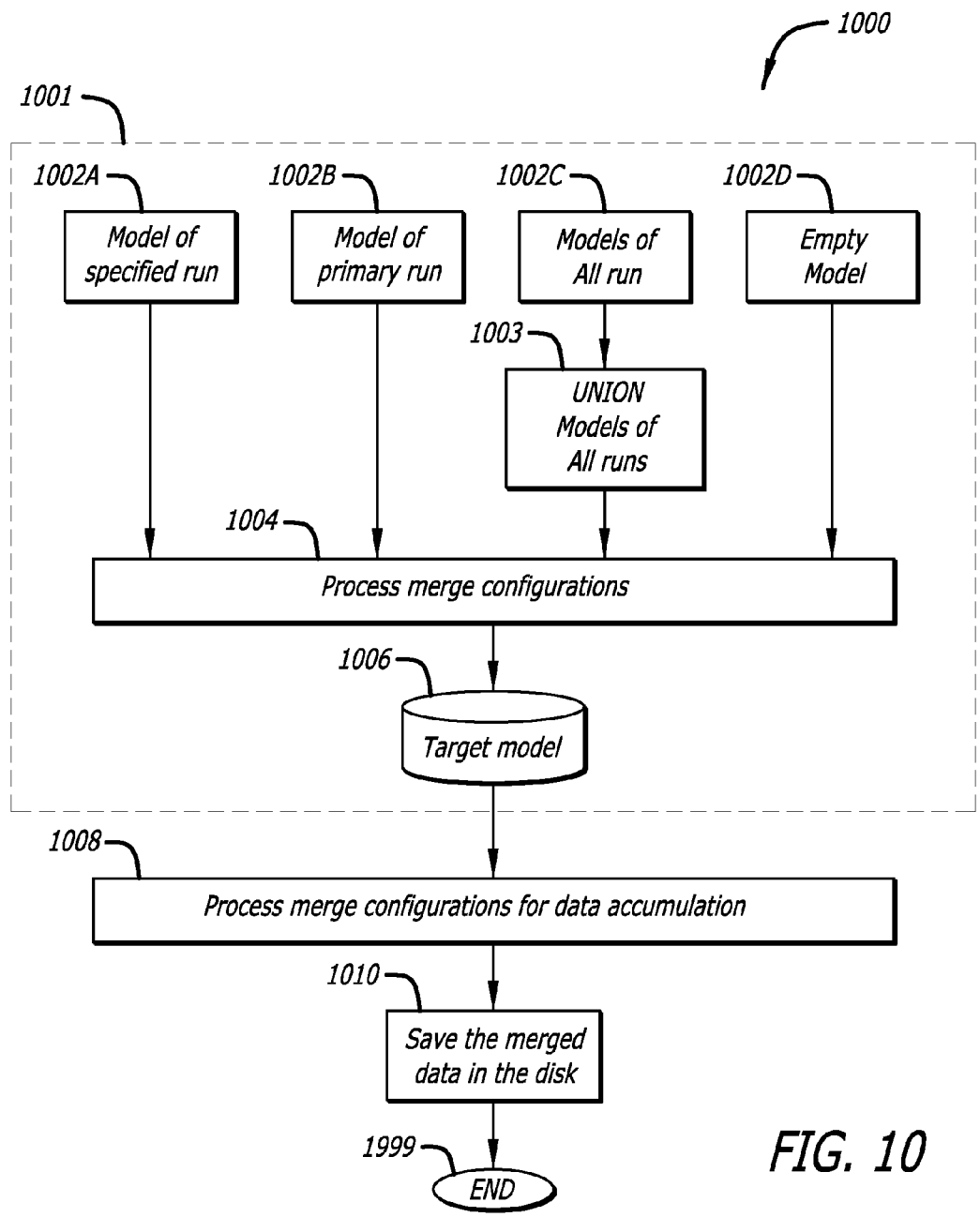
FIG. 10 is a functional block diagram of a configuration based merge algorithm for metric driven verification.

Referring now to FIG. 10, a functional block diagram of a merge coverage data algorithm 1000 is illustrated that is responsive to a merge command. FIG. 10 illustrates different stages of the merge coverage data algorithm 1000, including:

1. Target model generation 1001
2. Data accumulation 1008
3. Save merged result 1010

The following is pseudo-code or BNR details of the different stages of the merge coverage data algorithm:

```
// runList=set of runs to be merged
// mergeConfigList=set of merge configurations
// output=output test where the result of the merged database is stored
Merge(runList, modConfigList, output)
{
// Prepare target model
Target_model=Create_target_model(runList, mergeConfigList, init_model_mode, run_order_mode)
// reset all counts in target model
RESET_COUNT(resultant_model)
// Do data accumulation/projection
Do_data_projection(Target_model, runList, mergeConfigList, init_model_mode, run_order_mode)
// Save the merge result in output
Save_result(Target_model, output)
}
```

Target model generation. Target model generation 1001 starts with a selection of an initial coverage model. The initial coverage model may be:
a. Model of any specified run 1002A
b. Model of primary run 1002B
c. Unioned model of all runs 1003
d. Empty model 1002D At process 1004, all merge configurations are then processed after the initial coverage model is selected. A merge configuration specifies source and target node with conflict resolution (initial or union). For any initial coverage model but an empty model, the source and the target hierarchy specified in the merge configurations are unioned to create the final target model if the resolution mode is specified as union. For an initial coverage model selected to be an empty model, all source nodes are copied into the empty model to create the final target model.

The following is pseudo-code or BNR details of processing merge configurations 1004:

```
// It creates the target model for different mode of
initial model
Create_target_model(runList, mergeConfigList,
init_model_mode, run_order_mode)
{
   If (init_model_mode == <run_path>) {
      // Read the model of the test <run_path>
      Target_model = MODEL(<run_path>)
      // Process the merge_config
      For each secondary run "sr" {
         Sec_model = MODEL(sr)
         Union_hierarchy(Target_model, Sec_model,
mergeConfigList)
      }
   }
   Else If (init_model_mode == primary_run) {
      If( run_order_mode = by_timestamp) {
         // Sort the runList on the basis of the timestamp
of model
         SORT(runList, TIMESTAMP)
      }
      // Read the model of the first test of runList
      Target_model = MODEL(runList[0])
      // Process the merge_config
      For each secondary run "sr" {
         Sec_model = MODEL(sr)
         Union_hierarchy(Target_model, Sec_model,
mergeConfigList)
      }
   }
   Else if( init_model_mode == union_all) {
      If( run_order_mode = by_timestamp) {
         // Sort the runList on the basis of the timestamp
of model
         SORT(runList, TIMESTAMP)
      }
      // Union all Models
      Target_model = MODEL(runList[0])
      For each remaining run "ts" of runList {
         Sec_model = MODEL(ts)
         UNION(Target_model, Sec_model)
      }
      // Process the merge_config
      For each secondary run "sr" {
         Sec_model = MODEL(sr)
         Union_hierarchy(Target_model, Sec_model,
mergeConfigList)
      }
   }
   Else if( init_model_mode == empty) {
      If( run_order_mode = by_timestamp) {
         // Sort the runList on the basis of the timestamp
of model
         SORT(runList, TIMESTAMP)
      }
      // Create a dummy model from the source node of
primary run
      Prim_model = MODEL(runList[0])
      // Create the target model from the source of first
merge_config
      Target_model =
Create_dummy_model(Prim_model,SOURCE(mergeConfigList[0]))
      For each secondary run "sr" {
         Sec_model = MODEL(sr)
```

```
        For each remaining merge_config "mc" of
mergeConfigList {
CREATE_NEW_TARGET(Target_model,TARGET(mc),SOURCE(mc))
        }
    }
}
// It union the source node of secondary model in to the
// target node of target model
Union_hierarchy(Target_model, Sec_model, mergeConfigList)
{
    For each merge_config "mc" of mergeConfigList {
        If(TARGET(mc) does not exist in Target_model)
            CREATE_NEW_TARGET(Target_model,
TARGET(mc),SOURCE(mc))
            // If the resolution mode of merge_config is UNION
            // then UNION the source/target sub-hierarchy
            If(RESOLUTION(mc) == UNION)
                UNION (Target_model, Sec_model, TARGET(mc),
SOURCE(mc)
```

The result of processing the merge configurations 1004 is a target coverage model 1006 that is saved in a storage device or storage media. After the target coverage model 1006 is generated, data can be accumulated in response thereto at process 1008 to obtain merged coverage data results.

Data Accumulation.

After formation of the target coverage model 1006, the coverage data of various verification runs are projected into the target coverage model 1006. If the merge configuration was specified, data projection is done for the specified source/target node in the data accumulation process 1008. If the merge configuration is not specified, then the complete data of the verification runs are projected into the model in the data accumulation process 1008.

The following is pseudo-code or BNR details of the data accumulation process 1008:

```
        Do_data_projection(Target_model, runList, mergeConfigList,
        init_model_mode, run_order_mode)
        {
        Data_accumulation_status = FALSE
        // Try to project data on the basis of merge_config
        For each run "ts" of runList {
            For each merge_config "mc" of mergeConfigList {
                If(TARGET(mc) exist in Target_model) {
DATA_PROJECT_HIERARCHY(ts,Target_model,TARGET(mc),
SOURCE(mc))
                    Data_accumulation_status = TRUE
                }
            }
        }
        // If projection failed then try with complete data
        If (Data_accumulation_status == FALSE)
            DATA_PROJECT(ts,Target_model)
        }
```

Save the Merged Result.

After the data accumulation process 1008, the merged coverage result in the target coverage model 1006 can saved into the desired output test name.

At process 1010, the merged coverage data results are saved by being stored into a storage device or storage media. With the merged coverage data results (e.g., the coverage model and the coverage data) of the merge operation being saved, the process can end at process 1999.

Integrated Circuit Design System

Figure 12:
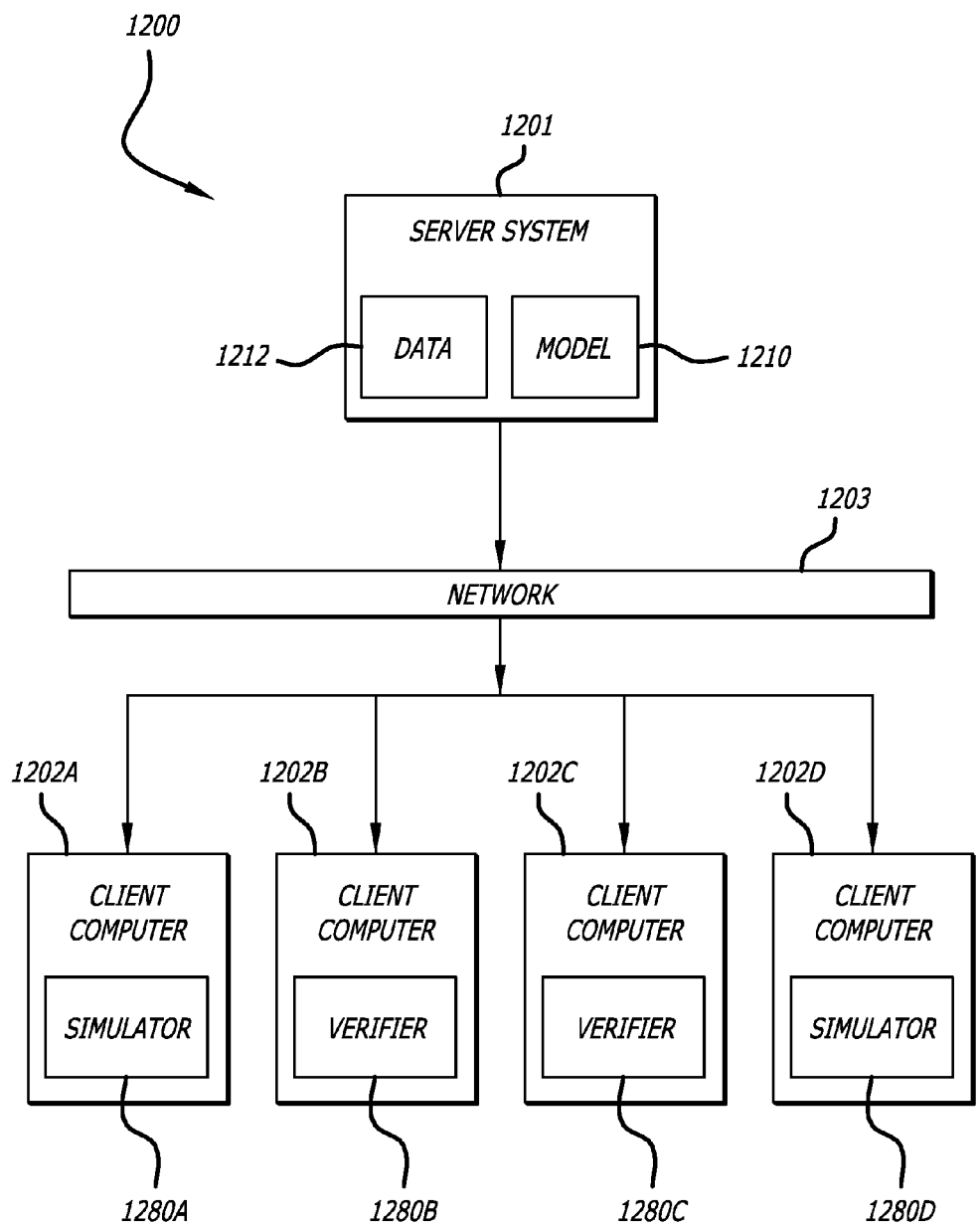
FIG. 12 is a block diagram of a client server integrated circuit design system.

Referring now to FIG. 12, a client-server integrated circuit design system 1200 is illustrated including a server system 1201 and client computer systems 1202A-1202D coupled together by a network 1203. Users may operate each of the client computer systems and execute instructions of various software programs 1280A-1280D to design the same integrated circuit.

Program 1280A, a first functional simulation design tool, may be used to simulate the functionality of the design of a first set of one or more logic blocks. Program 1280D, a second functional simulation design tool, may be used to simulate the functionality of the design of a second set of one or more logic blocks. Program 1280B, a first verification design tool, may be used to verify the functionality of the design of a first set of one or more logic blocks. Program 1280C, a second verification design tool, may be used to verify the functionality of the design of a second set of one or more logic blocks. A user may use either verification software program to merge the coverage data results for the first and second sets of logic blocks together.

The coverage data results for an integrated circuit design may merged together and stored in a single coverage data base 1212 maintained by the server system 1201. A coverage model 1210 for the integrated circuit design may be stored and supplied by the server system to each of the client computer systems to aid in the verification of the integrated circuit design. The coverage data base 1212 and coverage model 1210 may be communicated to the client computer systems over the network 1203.

Figure 13:
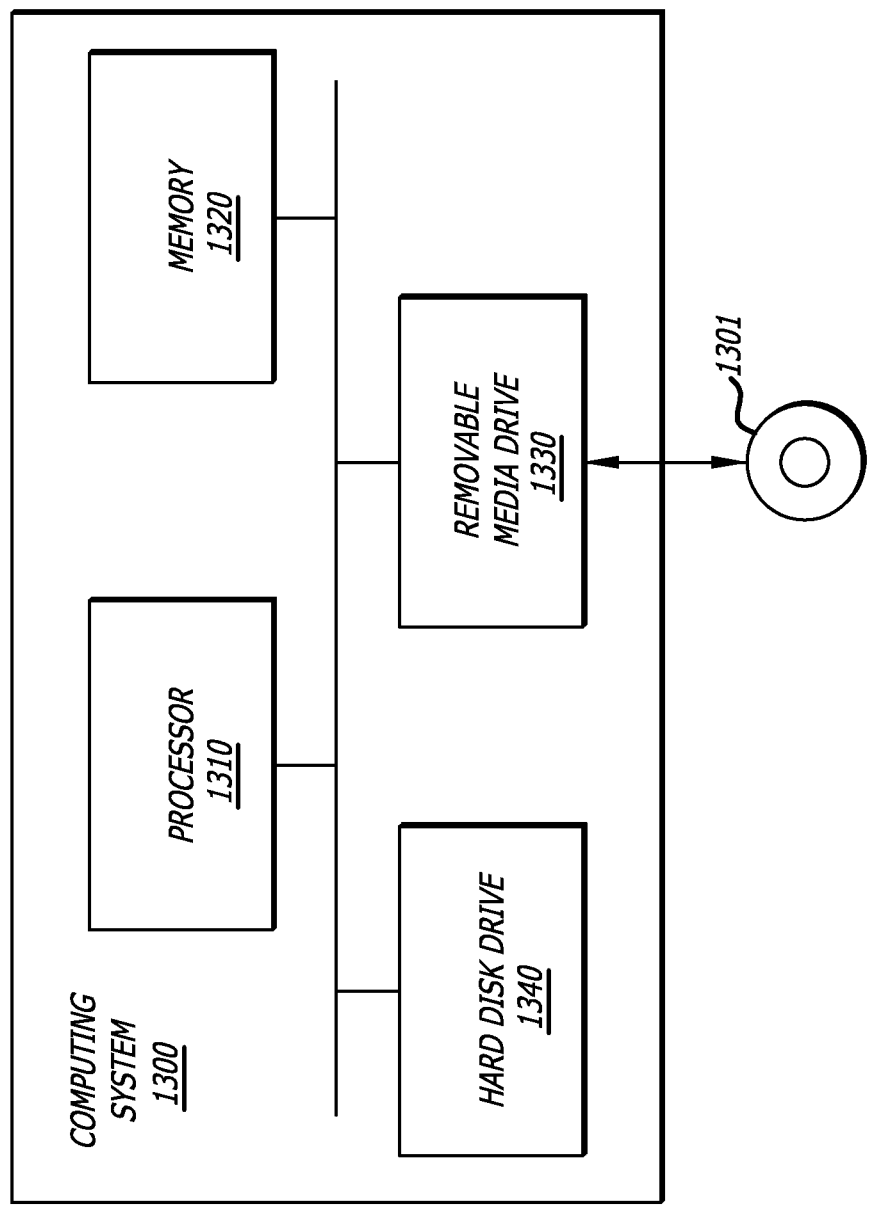
FIG. 13 is a block diagram of an exemplary computer system for the integrated circuit design system.

Referring now to FIG. 13, each instance of the server system 1201 and client computer system 1202A-1202D may be a computer system 1300. In one embodiment of the invention, the computing system 1300 includes a processor 1310, a memory 1320, a removable media drive 1330, and a hard disk drive 1340.

The computer system 1300 executes instructions of an operating system in additional to instructions of the integrated circuit design software. The computer system 1300 may be used to perform some or all of the processes in accordance with a number of embodiments of the invention.

In one embodiment, the processor 1310 executes instructions stored or residing in a machine-readable storage medium or device, such as the hard disk drive 1340, a removable medium 1301 (e.g., an optical medium (compact disk (CD), digital video disk (DVD), etc.), a magnetic medium (magnetic disk, a magnetic tape, etc.), or a combination of both. The instructions may be loaded from the machine-readable medium and stored into another storage medium or device such as the memory 1320, which may include Random Access Memory (RAM), dynamic RAM (DRAM), or other type of storage device or mechanism. The processor 1310 may retrieve the instructions from the memory 1320 and execute the instructions to perform the operations described herein.

Note that any or all of the components and the associated hardware illustrated in FIG. 13 may be used in various embodiments of the system 1200. However, it should be appreciated that other configurations of the systems 1200 and 1300 may include more or less devices than those shown in FIG. 13.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result.

The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

When implemented as an apparatus for performing the operations described herein, the apparatus may be specially constructed for the required purposes, or it may comprise a general-purpose computer selectively activated or reconfigured by a computer program stored in the computer. Such a computer program may be stored in a computer readable storage medium, any type of storage media or device suitable for storing electronic instructions, and each coupled to a computer system bus.

The processes presented herein are not inherently related to any particular computer or other apparatus. Various general-purpose systems may be used with programs in accordance with the teachings herein, or it may prove convenient to construct a more specialized apparatus to perform the operations described.

When implemented in software, the elements of the embodiments of the invention are essentially the program, code segments, or instructions to perform the tasks. The program, code segments, or instructions can be stored in a processor readable medium or storage device that can be read and executed by a processor or other type of computing machine. The processor readable medium may include any storage medium or storage device that can store information in a form readable by a processor or other type of computing machine. The program or code segments may be downloaded via computer networks such as the Internet, Intranet, etc. and stored in the processor readable medium or storage device.

When implemented as a system, such as an electronic computer aided design (ECAD) system, the elements of the embodiments of the invention include one or more processors to execute the program, code segments, or instructions that may be stored in a processor readable medium or storage device to perform the tasks or functions of a method or process. The one or more processors may be specifically adapted to electronic computer aided design including processing logic that may comprise hardware (e.g., circuitry, dedicated logic, etc.), software, or a combination of both.

CONCLUSION

The embodiments of the invention are thus described. While embodiments of the invention have been particularly described, they should not be construed as limited by such embodiments. It is to be understood that such embodiments are merely illustrative of and not restrictive on the broad invention, and that the embodiments of the invention not be limited to the specific constructions and arrangements shown and described, since various other modifications may occur to those ordinarily skilled in the art. For example, it will be appreciated that a variety of programming languages may be used to implement the teachings of the invention as described herein. Instead, the embodiments of the invention should be construed according to the claims that follow below.

What is claimed is:

1. A method for verification of an integrated circuit design, the method comprising:
    independently executing a plurality of simulation runs in response to a plurality of coverage models to respectively generate a plurality of coverage data for a plurality of functional blocks within one or more integrated circuit designs;
    generating a target coverage model to selectively merge at least first coverage data associated with a first coverage model and at least second coverage data associated with a second coverage model;
    in response to the target coverage model and the plurality of simulation runs, selectively projecting the plurality of coverage data into a merged coverage data result associated with the target coverage model; and
    wherein one or more of the independent execution, the generating, and the selective projecting are automatically performed with a processor.

2. The method of claim 1, wherein
    the plurality of simulation runs comprises a functional simulation run associated with the first coverage model and a formal verification run associated with the second coverage model to generate the plurality of coverage data; and
    the selective projection of the plurality of coverage data projects the plurality of coverage data from differing types of simulation runs into the merged coverage data result.

3. The method of claim 1, further comprising:
    storing the merged coverage data results into a storage device.

4. The method of claim 1, wherein
    the generating of the target coverage model includes
        selecting one or more merge configurations, and
        merging the one or more merge configurations into the target coverage model.

5. A system for verifying functionality of an integrated circuit design, the system comprising:
    a processor to execute instructions;
    a storage device coupled to the processor, the storage device to store instructions for execution by the processor including one or more instructions to receive
        a selected set of a plurality of independent simulation runs from which to read coverage data for a merge operation;
        a merging order of the plurality of independent simulation runs in the selected set for the merge operation; and
        a merge configuration to map one or more source nodes into one or more target nodes across a hierarchy of coverage models associated with each of the plurality of independent simulation runs in the selected set for the merge operation.

6. The system of claim 5, wherein
the merge configuration includes one or more of source nodes, one or more target nodes, a model conflict resolution procedure mode, an initial target model, and an output name.

7. The system of claim 6, wherein
the initial target model is selected to be a coverage model of one of the plurality of independent simulation runs in the selected set, a union of two or more coverage models of the plurality of independent simulation runs, a coverage model of a primary verification run, or an empty coverage model with all source nodes copied therein.

8. The system of claim 6, wherein
the conflict resolution procedure mode is an initial conflict resolution mode.

9. The system of claim 6, wherein
the conflict resolution procedure mode is a union conflict resolution mode.

10. The system of claim 9, wherein
the initial target model is selected to be a coverage model of one of the plurality of independent simulation runs in the selected set, a union of two or more coverage models of the plurality of independent simulation runs, or a coverage model of a primary verification run; and
each source hierarchy of source nodes in each coverage model and each target hierarchy of target nodes in each coverage model is unioned together to form a final target model.

11. The system of claim 5, wherein
the mapping provided by the merge configuration is a one to one mapping between the one or more source nodes and the one or more target nodes across the hierarchy of the coverage models.

12. The system of claim 5, wherein
the mapping provided by the merge configuration is a one to many mapping between one source node and a plurality of target nodes across the hierarchy of the coverage models.

13. The system of claim 5, wherein
the mapping provided by the merge configuration is a many to one mapping between a plurality of source nodes and the one target node across the hierarchy of the coverage models.

14. The system of claim 5, wherein
the mapping provided by the merge configuration is a many to many mapping between the one or more source nodes and the one or more target nodes across the hierarchy of the coverage models.

15. A non-transitory machine readable medium for verifying functionality of an integrated circuit design, the non-transitory machine readable medium comprising:
storage media to store instructions for execution by a processor including one or more instructions to
generate a target coverage model in response to a selection of an initial target coverage model;
selectively project coverage data of a selected plurality of simulation runs into the target coverage model in response to the target coverage model; and
save the target coverage model with the projected coverage data as merged coverage data results.

16. The non-transitory machine readable medium of claim 15, wherein
the one or more instructions to generate the target coverage model includes
one or more instructions to select the initial target coverage model from a plurality of coverage models respectively associated with a plurality of simulation runs, a primary coverage model of a primary simulation run, a unioned coverage model of a union of a selected plurality of coverage models associated with a selected plurality of simulation runs, or an empty coverage model that is with all source nodes copied therein.

17. The non-transitory machine readable medium of claim 15, wherein
the one or more instructions to selectively project coverage data of the selected plurality of simulation runs into the target coverage model includes
one or more instructions to select a subset of a plurality of simulation runs as the selected plurality of simulation runs.

18. The non-transitory machine readable medium of claim 17, wherein
the one or more instructions to selectively project coverage data of the selected plurality of simulation runs into the target coverage model further includes
one or more instructions to select an order of selectively projecting coverage data from the selected plurality of simulation runs into the target coverage model.

19. The non-transitory machine readable medium of claim 18, wherein
the one or more instructions to selectively project coverage data of the selected plurality of simulation runs into the target coverage model further includes
one or more instructions to selectively project coverage data from one or more source nodes into one or more target nodes.

20. The non-transitory machine readable medium of claim 18, wherein
the one or more instructions to selectively project coverage data of the selected plurality of simulation runs into the target coverage model further includes
one or more instructions to project all coverage data from the selected plurality of simulation runs into the target coverage model.

* * * * *